(12) United States Patent
Han et al.

(10) Patent No.: US 12,080,249 B2
(45) Date of Patent: Sep. 3, 2024

(54) DISPLAY APPARATUS AND METHOD OF COMPENSATING IMAGE OF DISPLAY PANEL USING THE SAME

(71) Applicant: SAMSUNG DISPLAY CO., LTD., Yongin-si (KR)

(72) Inventors: Sangmyeon Han, Hwaseong-si (KR); Seungho Park, Suwon-si (KR); Byoungkwan An, Suwon-si (KR); Jaehoon Lee, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 87 days.

(21) Appl. No.: 17/443,606

(22) Filed: Jul. 27, 2021

(65) Prior Publication Data

US 2022/0036834 A1 Feb. 3, 2022

(30) Foreign Application Priority Data

Aug. 3, 2020 (KR) ........................ 10-2020-0096672

(51) Int. Cl.
  *G09G 3/3291* (2016.01)
  *H10K 59/121* (2023.01)
(52) U.S. Cl.
  CPC ....... *G09G 3/3291* (2013.01); *H10K 59/1213* (2023.02); *H10K 59/1216* (2023.02); *G09G 2310/027* (2013.01); *G09G 2320/0257* (2013.01)
(58) Field of Classification Search
  CPC ........... G09G 3/3291; G09G 2310/027; G09G 2320/0257; G09G 2320/0271; G09G 2320/0295; G09G 2320/043; G09G 2320/048; G09G 3/3233; G09G 3/3208; G09G 3/3225; G09G 2340/0407; G09G 3/3275; G09G 2320/066; G09G 2320/0693; G09G 2340/04; H10K 59/1213; H10K 59/1216
See application file for complete search history.

(56) References Cited

U.S. PATENT DOCUMENTS

| 10,262,582 | B2 | 4/2019 | Han |
| 2013/0176324 | A1* | 7/2013 | Yamashita ............... G09G 3/32 345/589 |
| 2014/0176409 | A1 | 6/2014 | Kim et al. |
| 2017/0069238 | A1* | 3/2017 | Moon .................... G09G 3/006 |

(Continued)

FOREIGN PATENT DOCUMENTS

| KR | 1020180002099 | 1/2018 |
| KR | 1020180030342 | 3/2018 |
| KR | 10-1983764 | 5/2019 |

*Primary Examiner* — Roberto W Flores
(74) *Attorney, Agent, or Firm* — F. CHAU & ASSOCIATES, LLC

(57) ABSTRACT

A display apparatus includes a display panel, a driving controller and a data driver. The display panel includes a pixel. The driving controller generates an age compensation value using a sensed age generated based on sensing data of the pixel and an accumulated age generated based on accumulated grayscale values of input image data, generates a final age based on the age compensation value, and compensates a grayscale value of the input image data based on a final age to generate a data signal. The data driver converts the data signal to a data voltage and outputs the data voltage to the display panel.

25 Claims, 8 Drawing Sheets

(56) References Cited

U.S. PATENT DOCUMENTS

| | | | |
|---|---|---|---|
| 2017/0098403 A1* | 4/2017 | Chung | G09G 3/3266 |
| 2017/0213493 A1* | 7/2017 | Han | G09G 3/3208 |
| 2019/0164503 A1 | 5/2019 | An et al. | |
| 2021/0125533 A1* | 4/2021 | Wang | G09G 3/3233 |
| 2021/0150950 A1* | 5/2021 | Lin | G09G 3/3406 |

* cited by examiner

DISPLAY APPARATUS AND METHOD OF COMPENSATING IMAGE OF DISPLAY PANEL USING THE SAME

CROSS REFERENCE TO RELATED APPLICATIONS

This application claims priority under 35 U.S.C. § 119 from Korean Patent Application No. 10-2020-0096672, filed on Aug. 3, 2020 in the Korean Intellectual Property Office (KIPO), the contents of which are herein incorporated by reference in their entirety.

1. TECHNICAL FIELD

Embodiments of the present inventive concept are directed to a display apparatus and a method of compensating an image of a display panel using the display apparatus. More particularly, embodiments of the present inventive concept are directed to a display apparatus that predicts an age based on sensing data of a light emitting element and a method of compensating an image of a display panel using the display apparatus

2. DISCUSSION OF THE RELATED ART

In general, a display apparatus includes a display panel and a display panel driver. The display panel includes a plurality of gale lines, a plurality of data lines and a plurality of pixels. The display panel driver includes a gate driver, a data driver and a driving controller. The gate driver outputs gale signals to the gate lines. The data driver outputs data voltages to the data lines. The driving controller controls the gate driver and the data driver.

A light emitting element of a display panel may deteriorate as a usage time increases. When the light emitting element deteriorates, an afterimage may occur. To compensate an afterimage of a display panel, the driving controller accumulates the usage time of the light emitting element and the luminance of the light emitting element to calculate an age of the light emitting element.

However, when the age of a light emitting element is not accurately obtained, a grayscale value of the display panel might not be accurately compensated so that a display quality of the display panel may deteriorate.

SUMMARY

Embodiments of the present inventive concept provide a display apparatus that generates an age compensation value based on sensing data of a light emitting element to accurately predict an age of the light emitting element.

Embodiments of the present inventive concept also provide a method of compensating an image of a display panel using the display apparatus.

In an embodiment of a display apparatus according to the present inventive concept, the display apparatus includes a display panel, a driving controller and a data driver. The display panel includes a pixel. The driving controller generates an age compensation value using a sensed age generated based on sensing data of the pixel and an accumulated age generated based on accumulated grayscale values of input image data, generates a final age based on the age compensation value, and compensates a grayscale value of live input image data based on the final age to generate a data signal. The data driver converts the data signal to a data voltage and outputs the data voltage to the display panel.

In an embodiment, the driving controller may include an age determiner that generates the sensed age based on the sensing data and a parameter determiner that determines an age parameter using the sensed age and the accumulated age. The age parameter may be the age compensation value.

In an embodiment, the driving controller may further include an age accumulator that generates the accumulated age by accumulating the compensated grayscale value of the input image data, an age adjuster that receives the accumulated age and the age parameter and determines the final age, and a grayscale compensator that compensates an input grayscale value of the input image data and generates the compensated grayscale value based on the final age.

In an embodiment, the driving controller further includes a first resolution converter that converts a resolution of the sensing data to a reference resolution and outputs the sensing data with the reference resolution to the age determiner, and a second resolution converter that converts a resolution of the accumulated age to the reference resolution and outputs the accumulated age with live reference resolution to the parameter determiner.

In an embodiment, the parameter determiner may calculate first and second parameters a and b from a compensation function $SAGE = a \times AGE1 + b$, where SAGE denotes the sensed age, AGE1 denotes the accumulated age, a denotes a first parameter of the age parameter, and b denotes a second parameter of the age parameter.

In an embodiment, the driving controller may include an age determiner that generates the sensed age based on the sensing data and a weight determiner that determines an age weight using the sensed age and the accumulated age. The age weight may be the age compensation value.

In an embodiment, the driving controller may further include an age accumulator that generates the accumulated age by applying the age weight to the compensated grayscale value of the input image data, and a grayscale compensator that compensates an input grayscale value of the input image data and generates the compensated grayscale value based on the accumulated age. The final age may be the accumulated age.

In an embodiment, the driving controller may further include a first resolution converter that converts a resolution of the sensing data to a reference resolution and outputs the sensing data with the reference resolution to the age determiner, and a second resolution converter that converts a resolution of the accumulated age to the reference resolution and outputs the accumulated age with the reference resolution to the weight determiner.

In an embodiment, the weight determiner may calculate the age weight WT from a compensation function $SAGE = WT \times AGE$, where SAGE denotes the sensed age, AGE denotes the accumulated age, and WT denotes the age weight.

In an embodiment, the driving controller may include an age determiner that generates the sensed age based on the sensing data, a parameter determiner that determines an age parameter using the sensed age and the accumulated age, and a weight determiner that determines an age weight using the sensed age and the accumulated age. The age compensation value may include the age parameter and the age weight In an embodiment, the driving controller may further include an age accumulator that generates the accumulated age by applying the age weight to the compensated grayscale value of the input image data, an age adjuster that receives the accumulated age and the age parameter and determines the final age, and a grayscale compensator that compensates an input grayscale value of the input image data to generate the compensated grayscale value based on the final age.

In an embodiment, the pixel may include a first thin film transistor that applies a first power voltage to a second node in response to a signal of a first node, a second thin film transistor that outputs the data voltage to the first node in response to a first signal, a third thin film transistor that outputs a signal of the second node to a sensing node in response to a second signal, a storage capacitor that includes a first end portion connected to the first node and a second end portion connected to the second node, and a light emitting element that includes a first electrode connected to the second node and a second electrode that receives a second power voltage.

In an embodiment of a method of compensating an image of a display panel according to the present inventive concept, the method includes sensing a pixel of the display panel and generating sensing data, generating a sensed age based on the sensing data of the pixel, generating an accumulated age based on accumulated grayscale values of input image data, generating an age compensation value using the sensed age and the accumulated age, generating a final age based on the age compensation value, and compensating a grayscale value of the input image data based on the final age.

In an embodiment, a driving controller may generate the sensed age based on the sensing data and determine an age parameter using the sensed age and the accumulated age in a sensing period when the pixel is sensed. The age compensation value may be the age parameter.

In an embodiment, the driving controller may generate the accumulated age by accumulating the compensated grayscale value of the input image data, receive the accumulated age and the age parameter and determines the final age, and compensate an input grayscale value of the input image data to generate the compensated grayscale value based on the final age in a non-sensing period when the pixel is not sensed.

In an embodiment, a driving controller may generate the sensed age based on the sensing data, determine an age parameter using the sensed age and the accumulated age, evaluate an afterimage using a test pattern to which the age parameter is applied in a test mode, and store the age parameter when the afterimage satisfies an afterimage specification in a sensing period when the pixel is sensed. The age compensation value may be the age parameter.

In an embodiment, a driving controller may generate the sensed age based on the sensing data and determine an age weight using the sensed age and the accumulated age in a sensing period when the pixel is sensed. The age compensation value may be the age weight.

In an embodiment, the driving controller may generate the accumulated age by applying the age weight to the compensated grayscale value of the input image data, compensate an input grayscale value of the input image data, and generate the compensated grayscale value based on the accumulated age in a non-sensing period when the pixel is not sensed. The final age may be the accumulated age.

In an embodiment, a driving controller may generate the sensed age based on the sensing data, determine an age parameter using the sensed age and the accumulated age, and determine an age weight using the sensed age and the accumulated age in a sensing period when the pixel is sensed. The age compensation value may include the age parameter and the age weight.

In an embodiment, the driving controller may generate the accumulated age by applying the age weight to the compensated grayscale value of the input image data, receive the accumulated age and the age parameter, determine the final age, and compensate an input grayscale value of the input image data to generate the compensated grayscale value based on the final age in a non-sensing period when the pixel is not sensed.

In an embodiment of a display apparatus according to the present inventive concept, a display apparatus includes a display panel and a driving controller. The display panel includes a pixel. The driving controller includes an age determiner, a compensation value determiner, an age accumulator, and a grayscale compensator. The age determiner generates a sensed age based on sensing data of the pixel. The compensation value determiner determines an age compensation value using the sensed age and an accumulated age. The age accumulator generates the accumulated age by accumulating compensated grayscale value of input image data; and the grayscale compensator compensates an input grayscale value of the input image data and generates the compensated grayscale value based on a final age.

In an embodiment, the driving controller may generate a data signal from the compensated grayscale value of the input image data. The display apparatus may further include a data driver that converts the data signal to a data voltage and outputs the data voltage to the display panel.

In an embodiment, the compensation value determiner may be a parameter determiner that determines an age parameter using the sensed age and the accumulated age, where the age parameter is the age compensation value. The driving controller may further include an age adjuster that receives the accumulated age and the age parameter and determines the final age.

In an embodiment, the compensation value determiner may be a weight determiner that determines an age weight using the sensed age and the accumulated age, where the age weight is the age compensation value and the final age is the accumulated age.

In an embodiment, the compensation value determiner may include a parameter determiner that determines an age parameter using the sensed age and the accumulated age, and a weight determiner that determines an age weight using the sensed age and the accumulated age, where the age compensation value includes the age parameter and the age weight. The age accumulator may generate the accumulated age by applying the age weight to the compensated grayscale value of the input image data. The driving controller may further include an age adjuster that receives the accumulated age and the age parameter and determines the final age.

According to a display apparatus and a method of compensating an image of a display panel using a display apparatus, a sensed age is generated based on sensing data that includes characteristics of a light emitting element of the display panel and the sensing age is compared to an accumulated age generated using accumulated grayscale values to generate an age compensation value. A final age is determined using the age compensation value so that the age of the light emitting element can be accurately predicted.

According to embodiments, the sensed age is calculated in a sensing period and the accumulated age is calculated in every frame. Even in the non-sensing period between the sensing periods, the age compensation value that represents the sensed age and the accumulated age is continuously reflected in the final age so that a prediction accuracy of the final age is enhanced in the non-sensing period.

According to embodiments, the age of a light emitting element is accurately predicted and an image of a display panel is compensated using the age so that the display quality of the display panel is enhanced. In addition, the sensing cycle is set relatively long, so that the number of sensing times can be reduced and the inconvenience to a user can be minimized.

DETAILED DESCRIPTION

Hereinafter, embodiments of the present inventive concept will be described in detail with reference to the accompanying drawings.

Figure 1:
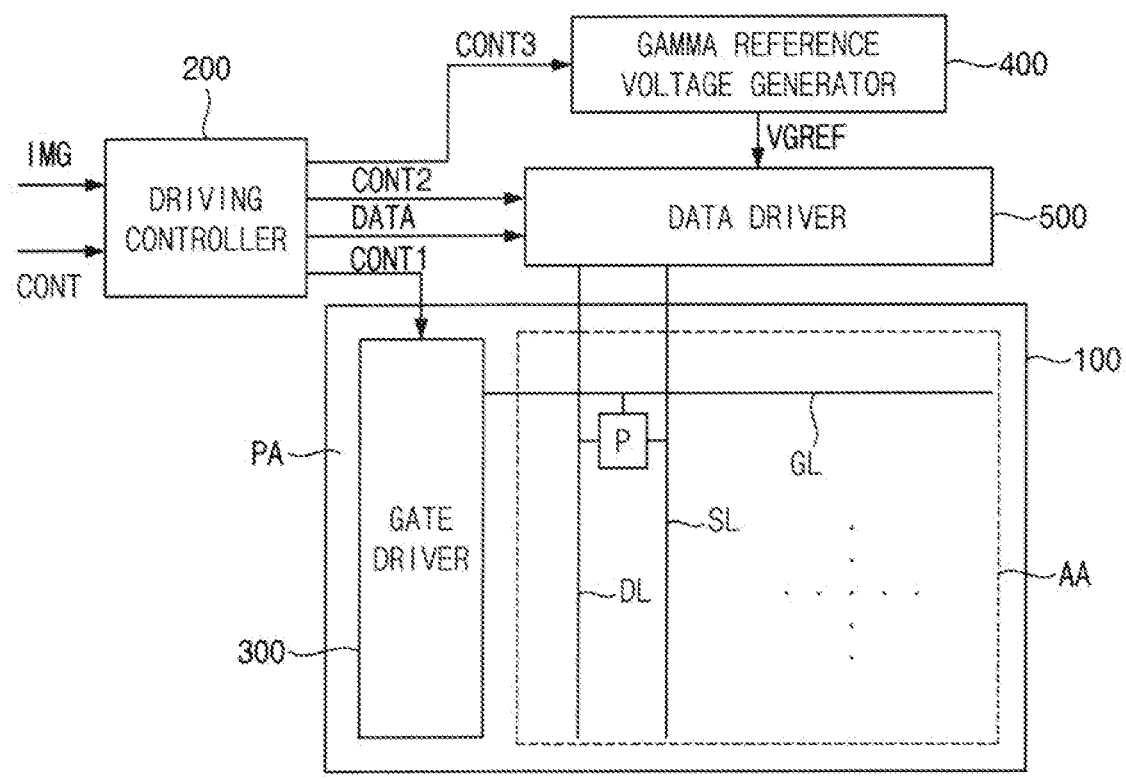
FIG. 1 is a block diagram of a display apparatus according to an embodiment of the present inventive concept.
Figure 1:
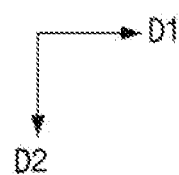

FIG. 1 is a block diagram of a display apparatus according to an embodiment of the present inventive concept.

Referring to FIG. 1, a display apparatus according to an embodiment includes a display panel 100 and a display panel driver. The display panel driver includes a driving controller 200, a gate driver 300, a gamma reference voltage generator 400 and a data driver 500.

For example, the driving controller 200 and the data driver 500 may be integrally formed. For example, the driving controller 200, the gamma reference voltage generator 400 and the data driver 500 may be integrally formed. A driving module that includes at least the driving controller 200 and the data driver 500 that are integrally formed may be referred to as a timing controller embedded data driver (TED).

The display panel 100 includes a display region AA on which an image is displayed and a peripheral region PA adjacent to the display region AA.

For example, in a present embodiment, the display panel 100 may be an organic light emitting diode display panel that includes an organic light emitting diode.

The display panel 100 includes a plurality of gate lines GL, a plurality of data lines DL and a plurality of pixels P connected to the gate lines GL and the data lines DL. The gate lines GL extend in a first direction D1 and the data lines DL extend in a second direction D2 that crosses the first direction D1.

In a present embodiment, the display panel 100 further includes a plurality of sensing lines SL connected to the pixels P. The sensing lines SL extend in the second direction D2.

In a present embodiment, the display panel driver includes a sensing circuit that receives a sensing signal from the pixels P of the display panel 100 through the sensing lines SL. The sensing circuit may be disposed in the data driver 500. Alternatively, the sensing circuit may be formed independently from the data driver 500. Embodiments of present inventive concept do not limit the position of the sensing circuit.

The driving controller 200 receives input image data IMG and an input control signal CONT from an external apparatus. In an embodiment, the input image data IMG includes red image data, green image data and blue image data. In an embodiment, the input image data IMG includes white image data. In an embodiment, the input image data IMG includes magenta image data, yellow image data and cyan image data. The input control signal CONT includes a master clock signal and a data enable signal. The input control signal CONT further includes a vertical synchronizing signal and a horizontal synchronizing signal.

The driving controller 200 generates a first control signal CONT1, a second control signal CONT2, a third control signal CONT3 and a data signal DATA based on the input image data IMG and the input control signal CONT.

The driving controller 200 generates the first control signal CONT1 that controls an operation of the gate driver 300 based on the input control signal CONT, and outputs the first control signal CONT1 to the gate driver 300. In an embodiment, the first control signal CONT1 further includes a vertical start signal and a gate clock signal.

The driving controller 200 generates the second control signal CONT2 that controls an operation of the data driver 500 based on the input control signal CONT, and outputs the second control signal CONT2 to the data driver 500. In an embodiment, the second control signal CONT2 includes a horizontal start signal and a load signal.

The driving controller 200 generates the data signal DATA based on the input image data IMG. The driving controller 200 outputs the data signal DATA to the data driver 500.

The driving controller 200 generates the third control signal CONT3 that controls an operation of the gamma reference voltage generator 400 based on the input control signal CONT, and outputs the third control signal CONT3 to the gamma reference voltage generator 400.

The gate driver 300 generates gate signals that drive the gate lines GL in response to the first control signal CONT1 received from the driving controller 200. The gate driver 300 outputs the gate signals to the gate lines GL. For example, the gate driver 300 sequentially outputs the gate signals to the gate lines GL.

In a present embodiment, the gate driver 300 is integrated into the peripheral region PA of the display panel 100.

The gamma reference voltage generator 400 generates a gamma reference voltage VGREF in response to the third control signal CONT3 received from the driving controller 200. The gamma reference voltage generator 400 outputs the gamma reference voltage VGREF to the data driver 500. The gamma reference voltage VGREF has a value that corresponds to a voltage level of the data signal DATA.

In an embodiment, the gamma reference voltage generator 400 may be disposed in the driving controller 200, or in the data driver 500.

The data driver 500 receives the second control signal CONT2 and the data signal DATA from the driving controller 200, and receives the gamma reference voltages VGREF from the gamma reference voltage generator 400. The data driver 500 converts the data signal DATA into analog data voltages using the gamma reference voltages VGREF. The data driver 500 outputs the data voltages to the data lines DL.

Figure 2:
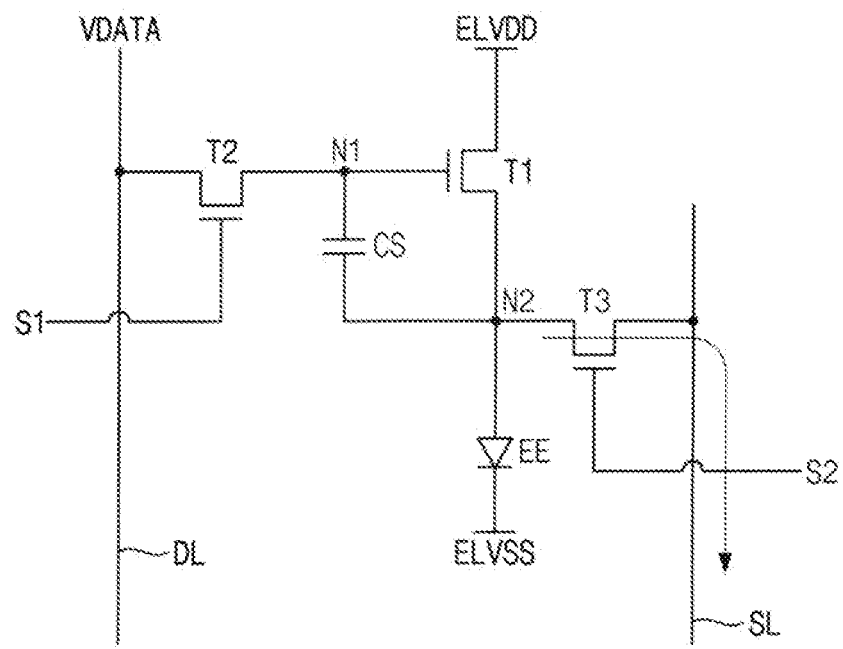
FIG. 2 is a circuit diagram of a pixel of FIG. 1.

FIG. 2 is a circuit diagram of the pixel P of FIG. 1.

Referring to FIGS. 1 and 2, in an embodiment, the pixel P includes a first thin film transistor T1 that transmits a first power voltage ELVDD to a second node N2 in response to a signal at a first node N1, a second thin film transistor T2 that outputs a data voltage VDATA to the first node N1, in response to a first signal S1, a third thin film transistor T3 that outputs a signal received from the second node N2 to a sensing node in response to a second signal S2, a storage capacitor CS that includes a first end portion connected to the first node N1 and a second end portion connected to the second node N2, and a light emitting element EE that includes a first electrode connected to the second node N2 and a second electrode that receives a second power voltage ELVSS.

Herein, in an embodiment, the second power voltage ELVSS is less than the first power voltage ELVDD. For example, the light emitting element EE is an organic light emitting diode.

The first signal S1 is activated in a sensing mode so that a data voltage VDATA can be transmitted to the first node N1 through the second thin film transistor T2. In an embodiment, the data voltage VDATA is a sensing data voltage that senses a characteristic of the light emitting element EE.

In sensing mode, in an embodiment, the first thin film transistor T1 is turned on by the sensing data voltage received from the first node in sensing mode. In addition, the second signal S2 is also activated in sensing mode so that the third thin film transistor T3 is turned on and sensing data that represents a characteristic of the light emitting element EE is output to the sensing line SL through the third thin film transistor T3 in sensing mode.

In an embodiment, the data driver 500 is operated in a writing mode or in sensing mode. In writing mode, the data voltage for displaying an image is transmitted to the pixels P of the display panel 100. In sensing mode, the sensing data is sensed from the pixels P. In writing mode, the data driver 500 outputs to the data lines DL a data voltage that corresponds to a grayscale value of the input image data IMG. In sensing mode, the data driver 500 outputs to the data lines DL the sensing data voltage for sensing characteristics of the light emitting element EE. The sensing data sensed through the sensing line SL is transmitted from the data driver 500 to the driving controller 200. Alternatively, in an embodiment, the driving controller 200 directly senses the sensing data from the pixels P.

Figure 3:
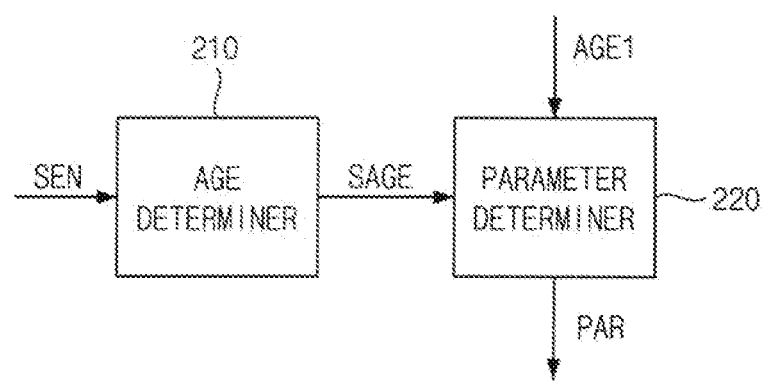
FIG. 3 is a block diagram of a driving controller of FIG. 1.
Figure 4:
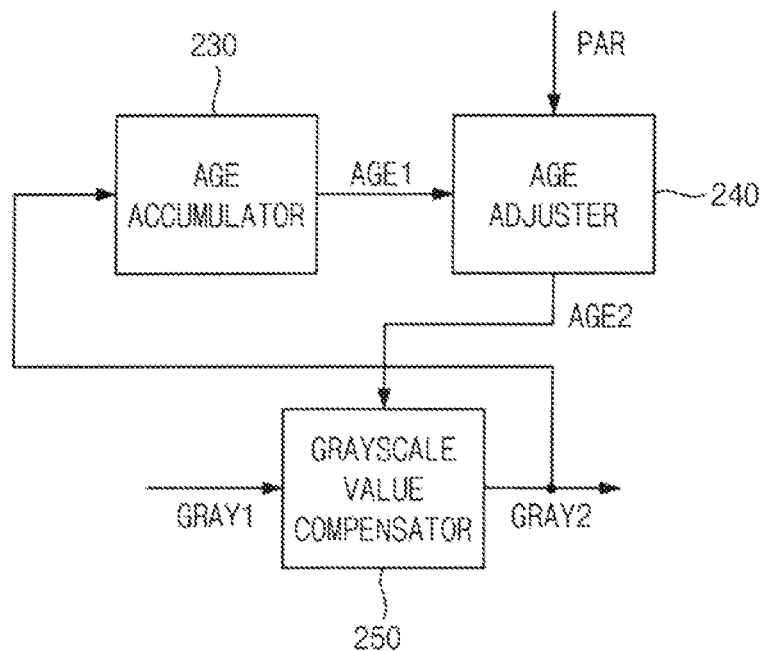
FIG. 4 is a block diagram of a driving controller of FIG. 1.
Figure 5:
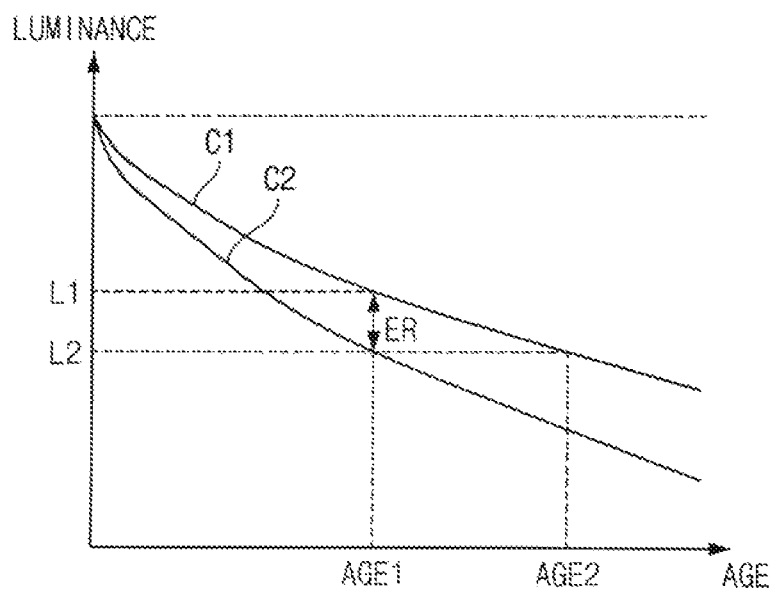
FIG. 5 is a graph of an operation of an age adjuster of FIG. 4.
Figure 6:
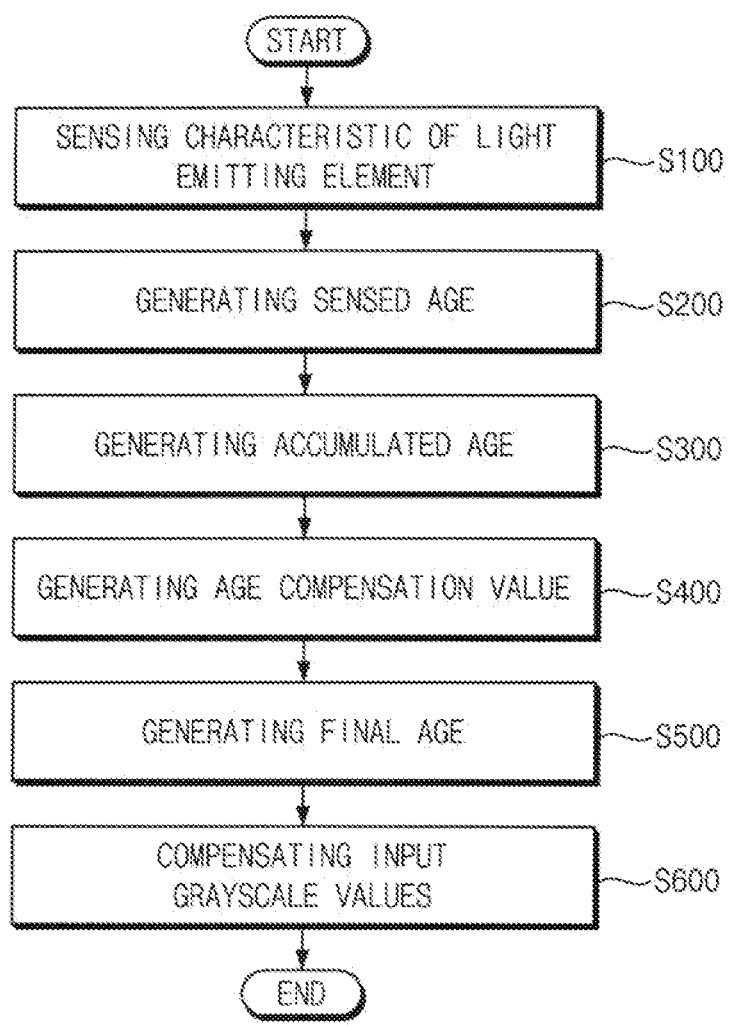
FIG. 6 is a flowchart of an operation of a driving controller of FIG. 1.

FIG. 3 is a block diagram of the driving controller 200 of FIG. 1. FIG. 4 is a block diagram of the driving controller 200 of FIG. 1. FIG. 5 is a graph of an operation of an age adjuster 240 of FIG. 4. FIG. 6 is a flowchart of an operation of the driving controller 200 of FIG. 1.

Referring to FIGS. 1 to 6, in an embodiment, the driving controller 200 generates an age compensation value PAR using a sensed age SAGE generated based on the sensing data SEN of the pixel P and an accumulated age AGE1 generated based on accumulated grayscale values. The driving controller 200 compensates a grayscale value of the input image data IMG based on the final age AGE2, to which the age compensation value PAR is applied, to generate the data signal DATA.

In a present embodiment, the sensed age SAGE, the accumulated age AGE1, the age compensation value PAR and the final age AGE2 have a resolution that corresponds to that of a pixel. In an embodiment, the sensed age SAGE, the accumulated age AGE1, the age compensation value PAR and the final age AGE2 have a resolution that corresponds to that of a pixel group that includes a plurality of pixels. When the resolution of the sensed age SAGE, the accumulated age AGE1, the age compensation value PAR and the final age AGE2 is in pixel units, the quality of the grayscale value compensation is enhanced but a load of the driving controller 200 and a size of a memory increases. Thus, the resolution of the sensed age SAGE, the accumulated age AGE1, the age compensation value PAR and the final age AGE2 is set considering the quality of the grayscale value compensation, the load of the driving controller 200 and the size of the memory.

In a present embodiment, the age compensation value PAR is an age parameter PAR that represents a relationship between the sensed age SAGE and the accumulated age AGE1.

In an embodiment, the driving controller 200 includes an age determiner 210, a parameter determiner 220, an age accumulator 230, an age adjuster 240 and a grayscale value compensator 250.

In an embodiment, the age determiner 210 and the parameter determiner 220 operate in sensing period when sensing the pixels P, where a sensing period refers to a period of time in which the driving controller operates the data driver in sensing mode. The age accumulator 230, the age adjuster 240 and the grayscale value compensator 250 operate in a non-sensing period when not sensing the pixels P. The sensing period may be part of a power-on period of a display apparatus or a power-off period of the display apparatus. In addition, the sensing period may be determined by a predetermined sensing cycle, which refers to a repeating sequence of a sensing period and a non-sensing period.

In an embodiment, the age accumulator 230, the age adjuster 240 and the grayscale value compensator 250 operate in every frame when the input image data IMG is input to the driving controller 200. In contrast, the age determiner 210 and the parameter determiner 220 operate in sensing period or in the predetermined sensing cycle.

In an embodiment, the age determiner 210 generates the sensed age SAGE based on the sensing data SEN. The parameter determiner 220 determines the age parameter PAR using the sensed age SAGE and the accumulated age AGE1.

For example, in an embodiment, let SAGE denote the sensed age, AGE1 denote the accumulated age, a denote a First parameter of the age parameter PAR, and b denote a second parameter of the age parameter PAR, the parameter determiner 220 calculates the first and second parameters a and b which satisfy a compensation function SAGE=a×AGE1+b.

Although the above compensation function is a linear function, embodiments of the present inventive concept are not limited thereto. For example, in an embodiment, the compensation function is a quadratic function such as SAGE=c×AGE1$^2$+d×AGE1+e. Here, the parameter determiner 220 calculates parameters c, d and e which satisfy the compensation function $SAGE=c \times AGE1^2+d \times AGE1+e$.

In an embodiment, the parameter determiner 220 calculates the age parameter PAR that represents the sensed age SAGE and the accumulated age AGE1 in sensing mode. The parameter determiner 220 stores the age parameter PAR in a memory of the driving controller 200.

In an embodiment, the age parameter PAR generated in the sensing period represents a relationship between the sensed age SAGE and the accumulated age AGE1 so that the final age AGE2 can be accurately predicted according to the change of the accumulated age AGE1, even in the non-sensing period where sensing is not performed.

In an embodiment, the age accumulator 230 generates the accumulated age AGE1 by accumulating the compensated grayscale value GRAY2 of the input image data IMG. When the amount of light emitted by the light emitting element EE is large according to the compensated grayscale value GRAY2 of the input image data IMG, the age accumulator 230 increases the accumulated age AGE1 by a large amount. When the amount of light emission of the light emitting element EE is small according to the compensated grayscale value GRAY2 of the input image data IMG, the age accumulator 230 increases the accumulated age AGE1 by a small amount.

In an embodiment, the age adjuster 240 receives the accumulated age AGE1 and the age parameter PAR and determines the final age AGE2. The age parameter PAR is determined by the parameter determiner 220 in the sensing period. The age adjuster 240 converts the accumulated age AGE1 to the final age AGE2 using the age parameter PAR.

In an embodiment, the grayscale value compensator 250 compensates an input grayscale value GRAY1 of the input image data IMG and generates the compensated grayscale value GRAY2 based on the final age AGE2. The grayscale value compensator 250 outputs the compensated grayscale value GRAY2 to the age accumulator 230.

In an embodiment, the driving controller 200 generates the data signal DATA based on the compensation grayscale value GRAY2 and outputs the data signal DATA to the data driver 500.

In FIG. 5, a first curve C1 represents a deterioration prediction model stored in the driving controller 200. A horizontal axis represents the age and a vertical axis represents a luminance. As shown in the graph of FIG. 5, the luminance gradually decreases as the age increases. Thus, the grayscale value compensator 250 predicts the luminance decrease according to the age using the deterioration prediction model and compensates the grayscale value to increase the luminance based on the luminance decrease.

A second curve C2 is an example of an actual deterioration model of the actual display panel 100. When the grayscale value is compensated by applying to the deterioration prediction model C1 the accumulated age AGE1 accumulated by the age accumulator 230, a compensation error may be generated by a difference ER of the deterioration prediction model C1 and the actual deterioration model C2.

In contrast, in an embodiment, when the accumulated age AGE1 is compensated to the final age AGE2 using the age adjuster 240, the final age AGE2 is applied to the deterioration prediction mode C1 so that the compensation error ER may be removed to enhance the accuracy of the grayscale value compensation.

FIG. 6 represents an operation of the age determiner 210 and an operation of the parameter determiner 220 in the sensing period, according to an embodiment.

In an embodiment, characteristics of the light emitting element EE are sensed (operation S100) and the sensing data SEN is transmitted to the age determiner 210, which converts the sensing data SEN to the sensed age SAGE (S200) and outputs the sensed age SAGE to an age compensation value determiner.

In an embodiment, the age accumulator 230 generates an accumulated age AGE1 based on accumulated grayscale values GRAY2 of input image data (operation S300).

In an embodiment, the age compensation value determiner determines the age compensation value of the compensation function (operation S400) from the sensed age SAGE and the accumulated age AGE1. The age compensation value may be one or both of the age parameter PAR or the age weight WT.

In an embodiment, the age adjuster 240 generates a final age AGE2 based on the age compensation value (operation S500), and the grayscale value compensator 250 compensates a grayscale value GRAY1 of the input image data based on the final age AGE2 (operation S600).

In an embodiment, the age parameter PAR is written to the memory of the driving controller 200. Then, when the driving controller 200 generates the data signal DATA based on the input image data IMG, the accumulated age AGE1 is converted into the final age AGE2 using the age parameter PAR stored in the memory.

According to a present embodiment, the sensed age SAGE is generated based on sensing data SEN that includes characteristics of the light emitting element EE of the display panel 100, and the sensing age SAGE is compared to the accumulated age AGE1 generated using the accumulated grayscale values to generate the age compensation value PAR. The final age AGE2 is determined using the age compensation value PAR so that the age of the light emitting element EE can be accurately predicted.

In an embodiment, the sensed age SAGE is calculated in the sensing cycle and the accumulated age AGE1 is calculated in every frame. Even in the non-sensing period between the sensing periods, the age compensation value PAR that represents the sensed age SAGE and the accumulated age AGE1 is continuously reflected in the final age AGE2 so that the prediction accuracy of the final age AGE2 is enhanced in the non-sensing period.

In an embodiment, the age of the light emitting element EE is accurately predicted and the image of the display panel 100 is compensated using the age so that the display quality of the display panel 100 can be enhanced. In addition, the sensing cycle can be set relatively long, so that the number of sensing times can be reduced and the inconvenience of a user can be minimized.

Figure 7:
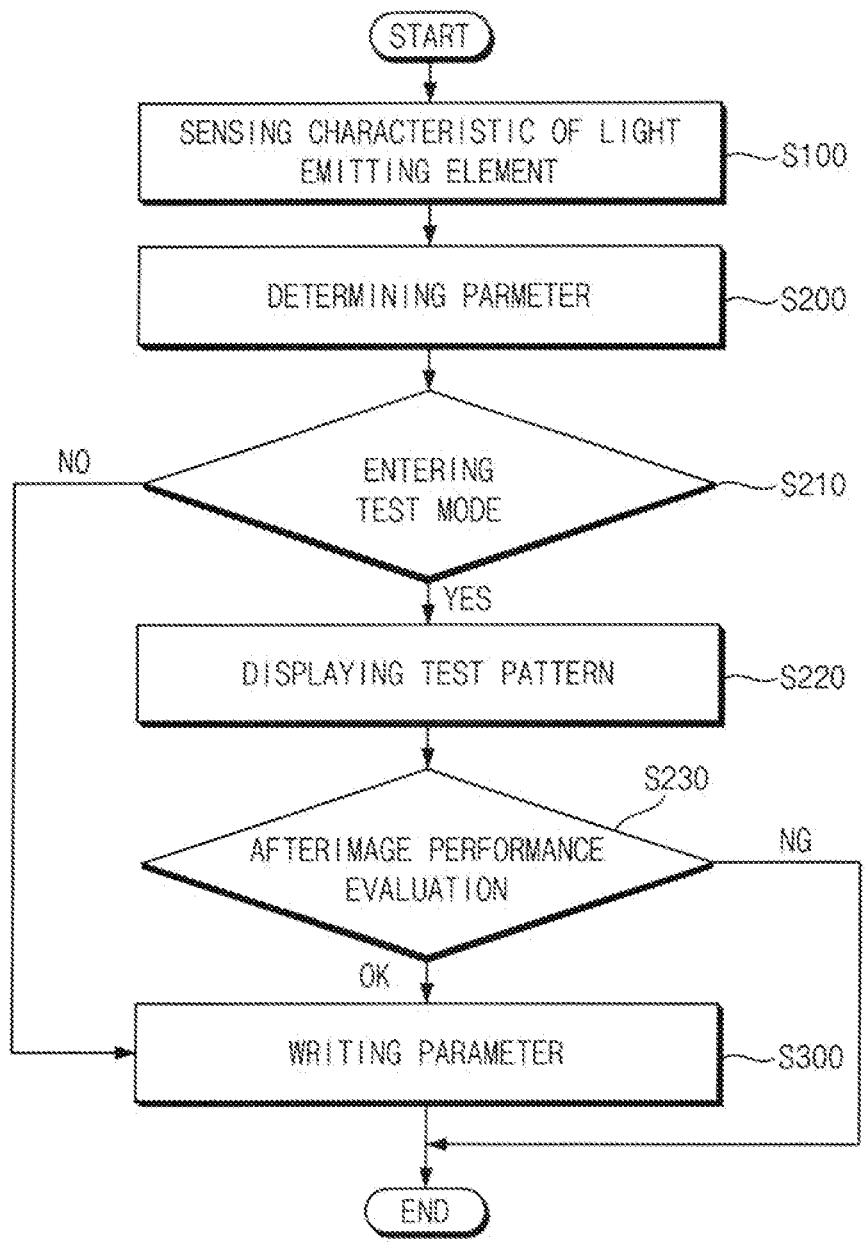
FIG. 7 is a flowchart of an operation of a driving controller of a display apparatus according to an embodiment of the present inventive concept.

FIG. 7 is a flowchart of an operation of a driving controller of a display apparatus according to an embodiment of the present inventive concept.

A display apparatus and a method of compensating an image of the display panel according to a present embodiment is substantially the same as a display apparatus and a method of compensating an image of a display panel of an embodiment described with reference to FIGS. 1 to 6 except for the operation of a test mode. Thus, the same reference numerals will be used to refer to the same or similar pans as those described in an embodiment of FIGS. 1 to 6 and any repetitive description concerning the above elements will be omitted.

Referring to FIGS. 1 to 5 and 7, a display apparatus according to an embodiment includes a display panel 100 and a display panel driver. The display panel driver includes a driving controller 200, a gate driver 300, a gamma reference voltage generator 400 and a data driver 500.

In an embodiment, the driving controller 200 generates an age compensation value PAR using a sensed age SAGE generated based on sensing data SEN of the pixel P and an accumulated age AGE1 generated based on accumulated grayscale values. The driving controller 200 compensates a grayscale value of the input image data IMG based on the final age AGE2, to which the age compensation value PAR is applied, to generate the data signal DATA.

FIG. 7 represents an operation of the age determiner 210 and an operation of the parameter determiner 220 in the sensing period, according to an embodiment.

In an embodiment, when characteristics of the light emitting element EE are sensed (operation S100) and the sensing data SEN is received by the age determiner 210, the age determiner 210 converts the sensing data SEN to the sensed age SAGE and outputs the sensed age SAGE to the parameter determiner 220.

In an embodiment, the parameter determiner 220 determines the age parameter PAR of the compensation function (operation S200).

In a present embodiment, a test mode for evaluating the quality of the age parameter PAR is added. Before entering test mode, as described in FIG. 6, the age parameter PAR is written to the memory of the driving controller 200 (operation S300). When entering test mode (operation S210), a test pattern is displayed on the display panel 100 (operation S220). The age parameter PAR is applied to the test pattern displayed on the display panel. A user can evaluate an afterimage using the test pattern to which the age parameter PAR is applied (operation S230). When the afterimage satisfies an afterimage specification, the age parameter PAR is written to the memory of the driving controller 200 (operation S300). When the afterimage does not satisfy the afterimage specification, the age parameter PAR is not written to the memory of the driving controller 200 and test mode is terminated. In this case, the conventional age parameter PAR written to the memory is maintained.

In an embodiment, when the driving controller 200 generates the data signal DATA based on the input image data IMG, the accumulated age AGE1 is converted into the final age AGE2 using the age parameter PAR stored in the memory.

According to a present embodiment, the sensed age SAGE is generated based on the sensing data SEN that includes characteristics of the light emitting element EE of the display panel 100, and the sensing age SAGE is compared to the accumulated age AGE1 generated using the accumulated grayscale values to generate the age compensation value PAR. The final age AGE2 is determined using the age compensation value PAR so that the age of the light emitting element EE can be accurately predicted.

In an embodiment, the sensed age SAGE is calculated in the sensing period and the accumulated age AGE1 is calculated in every frame. Even in the non-sensing period between the sensing periods, the age compensation value PAR that represents the sensed age SAGE and the accumulated age AGE1 is continuously reflected in the final age AGE2 so that the prediction accuracy of the final age AGE2 can be enhanced in the non-sensing period.

In an embodiment, the age of the light emitting element EE is accurately predicted and the image of the display panel 100 is compensated using the age so that the display quality of the display panel 100 is enhanced. In addition, the sensing cycle may be set relatively long, so that the number of sensing times can be reduced and the inconvenience of a user can be minimized.

Figure 8:
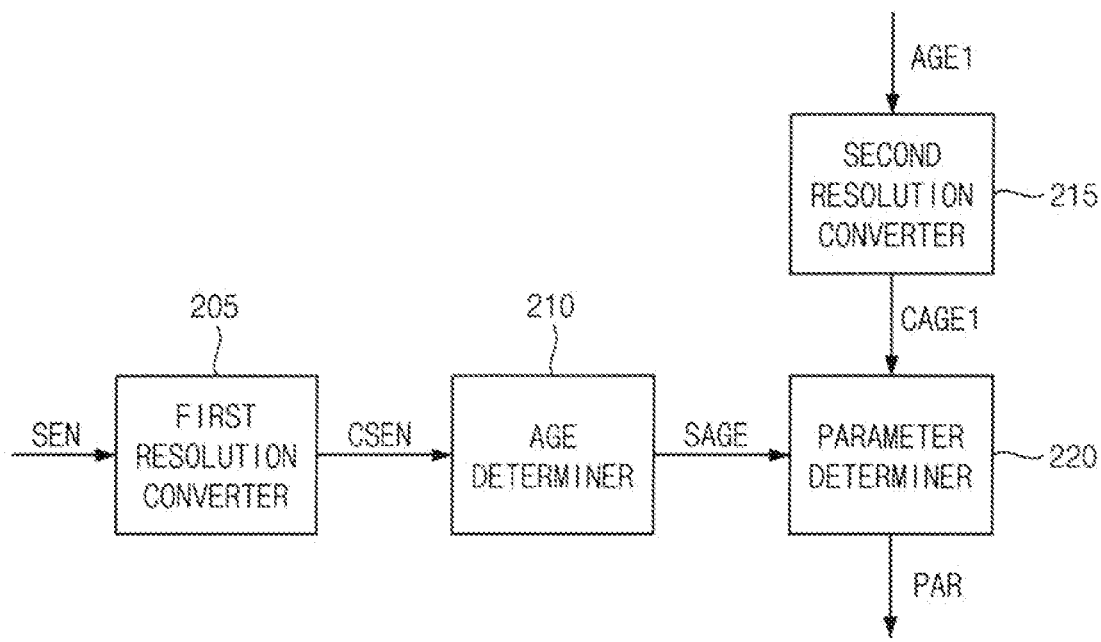
FIG. 8 is a block diagram of a driving controller of a display apparatus according to an embodiment of the present inventive concept.

FIG. 8 is a block diagram illustrating a driving controller 200 of a display apparatus according to an embodiment of the present inventive concept.

A display apparatus and a method of compensating an image of a display panel according to a present embodiment is substantially the same as a display apparatus and a method of compensating an image of a display panel of an embodiment described with reference to FIGS. 1 to 6 except for a structure of a driving controller. Thus, the same reference numerals will be used to refer to the same or similar parts as those described in an embodiment of FIGS. 1 to 6 and any repetitive description concerning the above elements will be omitted.

Referring to FIGS. 1, 2, 4 to 6 and 8, a display apparatus according to an embodiment includes a display panel 100 and a display panel driver. The display panel driver includes a driving controller 200, a gate driver 300, a gamma reference voltage generator 400 and a data driver 500.

In an embodiment, the driving controller 200 generates an age compensation value PAR using a sensed age SAGE generated based on sensing data SEN of the pixel P and an accumulated age AGE1 generated based on accumulated grayscale values. The driving controller 200 compensates a grayscale value of the input image data IMG based on the final age AGE2, to which the age compensation value PAR is applied, to generate the data signal DATA.

In an embodiment, the driving controller 200 includes an age determiner 210, a parameter determiner 220, an age accumulator 230, an age adjuster 240 and a grayscale value compensator 250. The age accumulator 230, the age adjuster 240 and the grayscale value compensator 250 are substantially the same as those described with reference to FIG. 4. The driving controller 200 further includes a first resolution converter 205 and a second resolution converter 215.

In an embodiment, the first resolution converter 205 converts the resolution of the sensing data SEN to a reference resolution and outputs to the age determiner 210 sensing data CSEN that has the reference resolution.

In an embodiment, the second resolution converter 215 converts the resolution of the accumulated age AGE1 to the reference resolution and outputs to the parameter determiner 220 the accumulated age CAGE1 that has the reference resolution.

In an embodiment, for the parameter determiner to generate the age parameter PAR that represents the relationship between the sensed age SAGE and the accumulated age CAGE1, the resolution of the sensed age SAGE and the resolution of the accumulated age CAGE1 should be equal. Thus, the driving controller 200 further includes the first resolution converter 205 and the second resolution converter 215 to match the resolution of the sensed age SAGE and the accumulated age CAGE1.

According to a present embodiment, the sensed age SAGE is generated based on sensing data SEN/CSEN that includes characteristics of the light emitting element EE of the display panel 100, and the sensing age SAGE is compared to the accumulated age AGE1/CAGE1 generated using the accumulated grayscale values to generate the age compensation value PAR. The final age AGE2 is determined using the age compensation value PAR so that the age of the light emitting element EE can be accurately predicted.

In an embodiment, the sensed age SAGE is calculated in the sensing period and the accumulated age AGE1 is calculated in every frame. Even in the non-sensing period between the sensing periods, the age compensation value PAR that represents the sensed age SAGE and the accumulated age AGE1/CAGE1 is continuously reflected in the final age AGE2 so that the prediction accuracy of the final age AGE2 can be enhanced in the non-sensing period.

In an embodiment, the age of the light emitting element EE is accurately predicted and the image of the display panel 100 is compensated using the age so that the display quality of the display panel 100 is enhanced. In addition, the sensing cycle is set relatively long, so that the number of sensing times can be reduced and the inconvenience of a user can be minimized.

Figure 9:
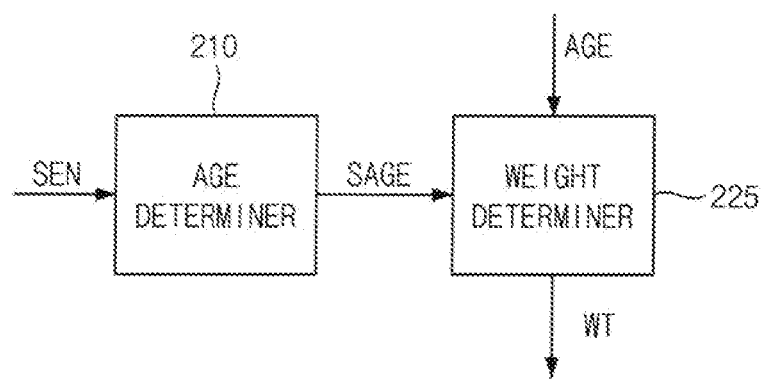
FIG. 9 is a block diagram of a driving controller of a display apparatus according to an embodiment of the present inventive concept.
Figure 10:
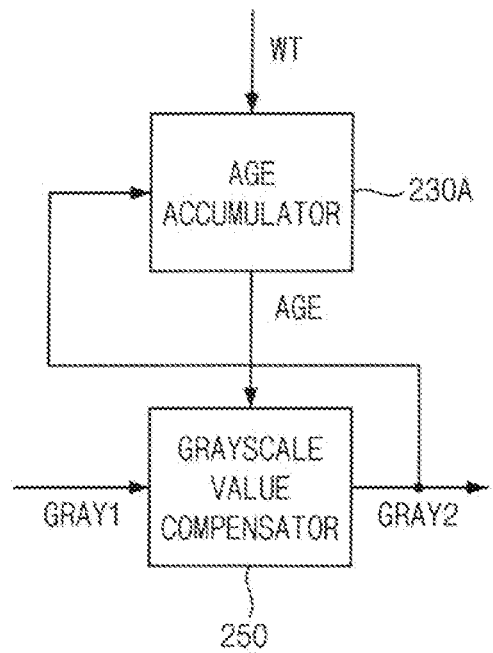
FIG. 10 is a block diagram of a driving controller of FIG. 9.

FIG. 9 is a block diagram of a driving controller 200 of a display apparatus according to an embodiment of the present inventive concept. FIG. 10 is a block diagram of u driving controller 200 of FIG. 9.

A display apparatus and a method of compensating an image of a display panel according to a present embodiment is substantially the same as a display apparatus and a method of compensating an image of a display panel of an embodiment described with reference to FIGS. 1 to 6 except for a structure of a driving controller. Thus, the same reference numerals will be used to refer to the same or similar parts as those described in an embodiment of FIGS. 1 to 6 and any repetitive description concerning the above elements will be omitted.

Referring to FIGS. 1, 2, 9 and 10, a display apparatus according to an embodiment includes a display panel 100 and a display panel driver. The display panel driver includes a driving controller 200, a gate driver 300, a gamma reference voltage generator 400 and a data driver 500.

In an embodiment, the driving controller 200 generates an age compensation value WT using a sensed age SAGE generated based on the sensing data SEN of the pixel P and an accumulated age AGE generated based on accumulated grayscale values. The driving controller 200 compensates a grayscale value of the input image data IMG based on the final age AGE, to which the age compensation value WT is applied, to generate the data signal DATA.

In a present embodiment, the age compensation value WT is an age weight WT that represents a relationship between the sensed age SAGE and the accumulated age AGE.

In an embodiment, the driving controller 200 includes an age determiner 210, a weight determiner 225, an age accumulator 230A and a grayscale value compensator 250.

In an embodiment, the age determiner 210 and the weight determiner 225 operate in a sensing period when sensing the pixels P. The age accumulator 230A and the grayscale value compensator 250 operate in a non-sensing period when not sensing the pixels P.

In an embodiment, the age accumulator 230A and the grayscale value compensator 250 operate in every frame when the input image data IMG is input to the driving controller 200. In contrast, the age determiner 210 and the weight determiner 225 operate in the predetermined sensing period.

In an embodiment, the age determiner 210 generates the sensed age SAGE based on the sensing data SEN. The weight determiner 225 determines the age weight WT using the sensed age SAGE and the accumulated age AGE.

For example, in an embodiment, letting SAGE denote the sensed age, AGE denote the accumulated age, and WT denote the age weight, the weight determiner 225 calculates the age weight WT from a compensation function $SAGE = WT \times AGE$.

Although the above compensation function is a linear function, embodiments of the present inventive concept are not limited thereto. For example, the compensation function may be a quadratic function such as $SAGE = WT2 \times AGE^2$. Here, the weight determiner 225 calculates the age weight WT2 from the compensation function $SAGE = WT2 \times AGE^2$.

In an embodiment, the weight determiner 225 calculates the age weight WT that represents the sensed age SAGE and the accumulated age AGE in the sensing period. The weight determiner 225 stores the age weight WT in the memory of the driving controller 200.

In an embodiment, the age accumulator 230A generates the accumulated age AGE by accumulating the compensated grayscale value GRAY2 of the input image data IMG. In a present embodiment, the age accumulator 230A generates the accumulated age AGE by applying the age weight WT to the compensated grayscale value GRAY2. In a present embodiment, the age weight WT that represents the sensed age SAGE and the accumulated age AGE is applied in a step of generating the accumulated age AGE so that the final age AGE is same as the accumulated age AGE.

In an embodiment, when the amount of light emitted by the light emitting element EE is large according to the compensated grayscale value GRAY2 of the input image data IMG, the age accumulator 230A increases the accumulated age AGE by a large amount. When the amount of light emitted by the light emitting element EE is small according to the compensated grayscale value GRAY2 of the input image data IMG, the age accumulator 230A increases the accumulated age AGE by a small amount.

In an embodiment, the grayscale value compensator 250 compensates an input grayscale value GRAY1 of the input image data IMG to generate the compensated grayscale value GRAY2 based on the final age AGE. The grayscale value compensator 250 outputs the compensated grayscale value GRAY2 to the age accumulator 230A.

In an embodiment, the driving controller 200 generates the data signal DATA based on the compensation grayscale value GRAY2 and outputs the data signal DATA to the data driver 500.

According to a present embodiment, the sensed age SAGE is generated based on sensing data SEN that includes characteristics of the light emitting element EE of the display panel 100, and the sensing age SAGE is compared to the accumulated age AGE generated using the accumulated grayscale values to generate the age compensation value WT. The final age AGE is determined using the age compensation value WT so that the age of the light emitting element EE can be accurately predicted.

In an embodiment, the sensed age SAGE is calculated in the sensing period and the accumulated age AGE is calculated in every frame. Even in the non-sensing period between the sensing periods, the age compensation value WT that represents the sensed age SAGE and the accumulated age AGE is continuously reflected in the final age AGE so that the prediction accuracy of the final age AGE is enhanced in the non-sensing period.

In an embodiment, the age of the light emitting element EE is accurately predicted and the image of the display panel 100 is compensated using the age so that the display quality of the display panel 100 is enhanced. In addition, the sensing cycle is set relatively long, so that the number of sensing times can be reduced and the inconvenience of a user can be minimized.

Figure 11:
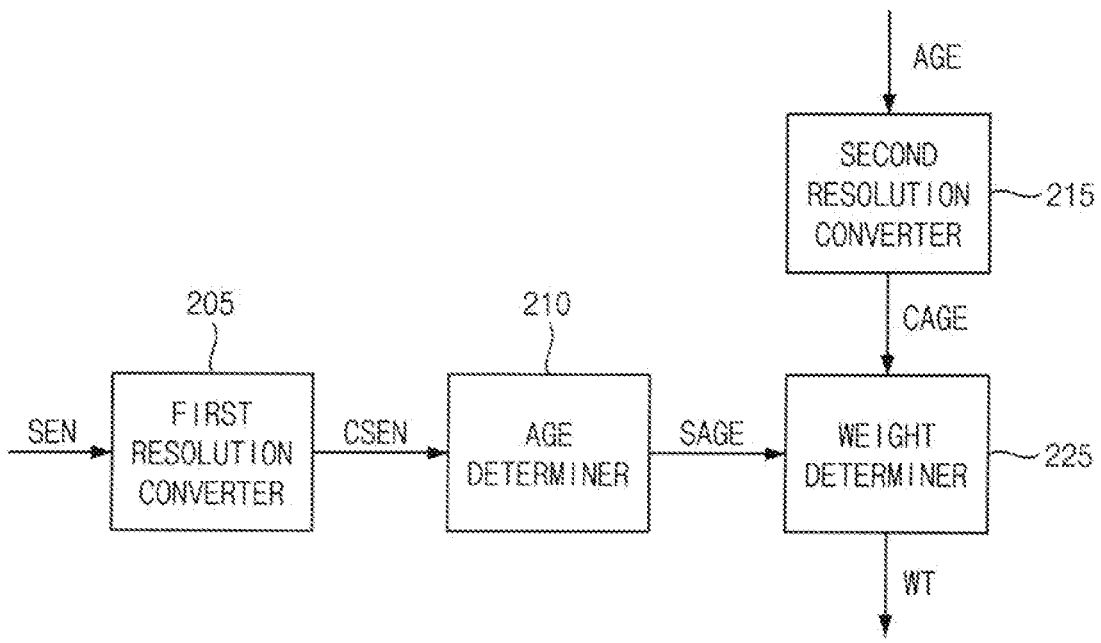
FIG. 11 is a block diagram of a driving controller of a display apparatus according to an embodiment of the present inventive concept.

FIG. 11 is a block diagram of a driving controller of a display apparatus according to an embodiment of the present inventive concept.

A display apparatus and a method of compensating an image of a display panel according to a present embodiment is substantially the same as a display apparatus and a method of compensating an image of a display panel of an embodiment described with reference to FIGS. 9 and 10 except for a structure of a driving controller. Thus, the same reference numerals will be used to refer to the same or similar parts as those described in an embodiment of FIGS. 9 and 10 and any repetitive description concerning the above elements will be omitted.

Referring to FIGS. 1, 2, 10 and 11, a display apparatus according to an embodiment includes a display panel 100 and a display panel driver. The display panel driver includes a driving controller 200, a gate driver 300, a gamma reference voltage generator 400 and a data driver 500.

In an embodiment, the driving controller 200 generates an age compensation value WT using a sensed age SAGE generated based on sensing data SEN of the pixel P and an accumulated age AGE generated based on accumulated grayscale values. The driving controller 200 compensates a grayscale value of the input image data IMG based on the final age AGE, to which the age compensation value WT is applied, to generate the data signal DATA.

In a present embodiment, the age compensation value WT is an age weight that represents a relationship between the sensed age SAGE and the accumulated age AGE.

In an embodiment, the driving controller 200 includes an age determiner 210, a weight determiner 225, an age accumulator 230A and a grayscale value compensator 250. The driving controller 200 further includes a first resolution converter 205 and a second resolution converter 215.

In an embodiment, the first resolution converter 205 converts the resolution of the sensing data SEN to a reference resolution and outputs to the age determiner 210 sensing data CSEN that has the reference resolution.

In an embodiment, the second resolution converter 215 converts the resolution of the accumulated age AGE to the reference resolution and outputs to the weight determiner 225 the accumulated age CAGE that has the reference resolution.

In an embodiment, for the weight determiner 225 to generate the age weight WT that represents the relationship between the sensed age SAGE and the accumulated age CAGE, the resolution of the sensed age SAGE and the resolution of the accumulated age CAGE should be equal. Thus, the driving controller 200 further includes the first resolution converter 205 and the second resolution converter 215 to match the resolution of the sensed age SAGE and the accumulated age CAGE.

According to a present embodiment, the sensed age SAGE is generated based on sensing data SEN/CSEN that includes characteristics of the light emitting element EE of the display panel 100, and the sensing age SAGE is compared to the accumulated age AGE/CAGE generated using the accumulated grayscale values to generate the compensation value WT. The final age AGE is determined using the age compensation value WT so that the age of the light emitting element EE can be accurately predicted.

In an embodiment, the sensed age SAGE is calculated in the sensing period and the accumulated age AGE1 is calculated in every frame. Even in the non-sensing period between the sensing periods, the age compensation value PAR that represents the sensed age SAGE and the accumulated age AGE/CAGE is continuously reflected in the final age AGE so that the prediction accuracy of the final age AGE is enhanced in the non-sensing period.

In an embodiment, the age of the light emitting element EE is accurately predicted and the image of the display panel 100 is compensated using the age so that the display quality of the display panel 100 is enhanced. In addition, the sensing cycle is set relatively long, so that the number of sensing limes can be reduced and the inconvenience of a user can be minimized.

Figure 12:
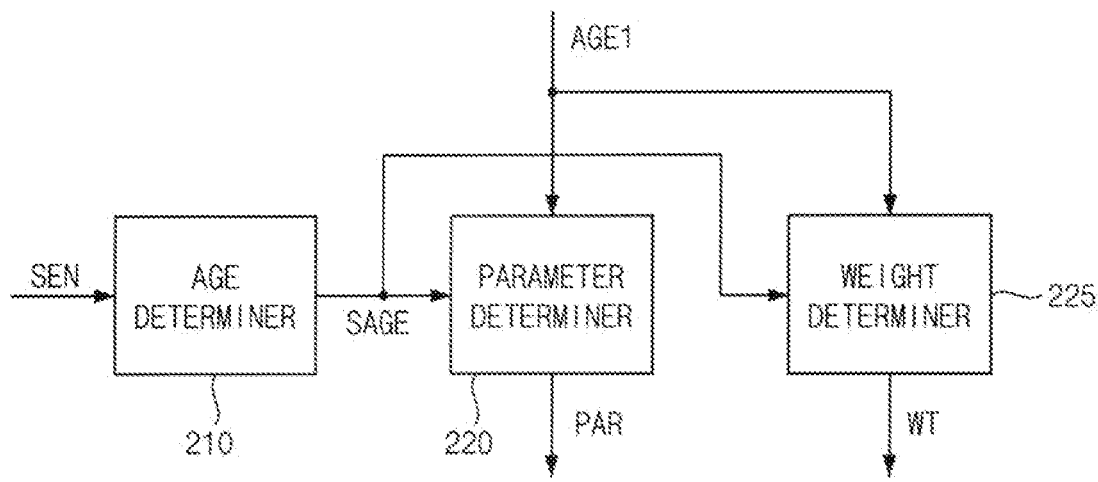
FIG. 12 is a block diagram of a driving controller of a display apparatus according to an embodiment of the present inventive concept.
Figure 13:
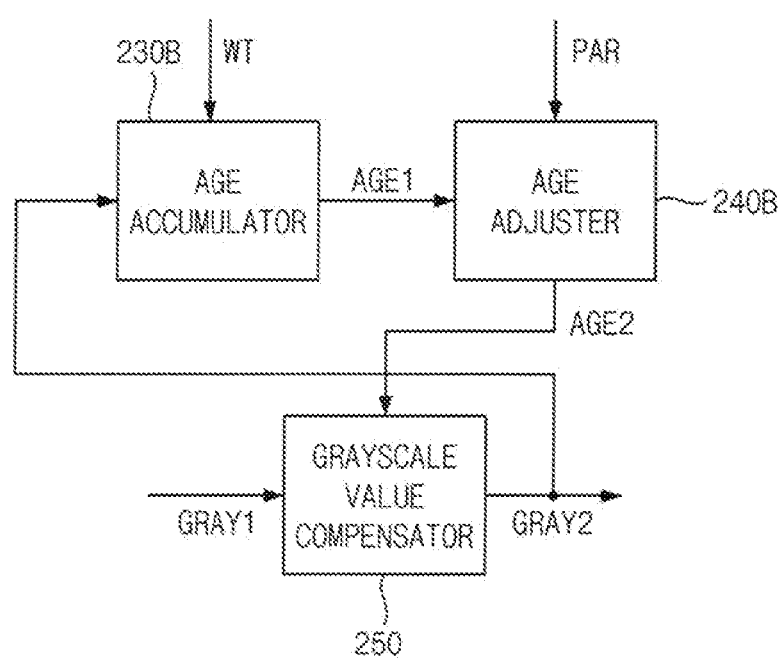
FIG. 13 is a block diagram of a driving controller of FIG. 12.

FIG. 12 is a block diagram of a driving controller 200 of a display apparatus according to an embodiment of the present inventive concept. FIG. 13 is a block diagram of a driving controller 200 of FIG. 12.

A display apparatus and a method of compensating an image of a display panel according to a present embodiment is substantially the same as a display apparatus and a method of compensating an image of a display panel of an embodiment described with reference to FIGS. 1 to 6 except for the structure of the driving controller. Thus, the same reference numerals will be used to refer to the same or similar pans as those described in an embodiment of FIGS. 1 to 6 and any repetitive description concerning the above elements will be omitted.

Referring to FIGS. 1, 2, 12 and 13, a display apparatus according to an embodiment includes a display panel 100 and a display panel driver. The display panel driver includes a driving controller 200, a gate driver 300, a gamma reference voltage generator 400 and a data driver 500.

In an embodiment, the driving controller 200 generates age compensation values PAR and WT using a sensed age SAGE generated based on sensing data SEN of the pixel P and an accumulated age AGE1 generated based on accumulated grayscale values. The driving controller 200 compensates a grayscale value of the input image data IMG based on the final age AGE2, to which the age compensation values PAR and WT are applied, to generate the data signal DATA.

In a present embodiment, the age compensation values PAR and WT include an age parameter PAR and an age weight WT that represent a relationship between the sensed age SAGE and the accumulated age AGE1.

In an embodiment, the driving controller 200 includes an age determiner 210, a parameter determiner 220, a weight determiner 225, an age accumulator 230B, an age adjuster 240B and a grayscale value compensator 250.

In an embodiment, the age determiner 210, the parameter determiner 220 and the weight determiner 225 operate in a sensing period when sensing the pixels P. The age accumulator 230B, the age adjuster 240B and the grayscale value compensator 250 operate in a non-sensing period when not sensing the pixels P.

In an embodiment, the age accumulator 230B, the age adjuster 240B and the grayscale value compensator 250 operate in every frame when the input image data IMG is input to the driving controller 200. In contrast, the age determiner 210, the parameter determiner 220 and the weight determiner 225 only operate in the predetermined sensing period.

In an embodiment, the age determiner 210 generates the sensed age SAGE based on sensing data SEN. The parameter determiner 220 determines the age parameter PAR using the sensed age SAGE and the accumulated age AGE1. The weight determiner 225 determines the age weight WT using the sensed age SAGE and the accumulated age AGE1.

In an embodiment, the parameter determiner 220 calculates the age parameter PAR that represents the sensed age SAGE and the accumulated age AGE1 in the sensing period. The parameter determiner 220 stores the age parameter PAR in the memory of the driving controller 200.

In an embodiment, the weight determiner 225 calculates the age weight WT that represents the sensed age SAGE and the accumulated age AGE1 in the sensing period. The weight determiner 225 stores the age weight WT in the memory of the driving controller 200.

In an embodiment, the age accumulator 230B generates the accumulated age AGE1 by accumulating the compensated grayscale values GRAY2 of the input image data IMG. In a present embodiment, the age accumulator 230B generates the accumulated age AGE1 by applying the age weight WT to the compensated grayscale value GRAY2. When the amount of light entitled by the light entitling element EE is large according to the compensated grayscale value GRAY2 of the input image data IMG, the age accumulator 230B increases the accumulated age AGE1 by a large amount. When the amount of light emitted by the light emitting element EE is small according to the compensated grayscale value GRAY2 of the input image data IMG, the age accumulator 230B may increase the accumulated age AGE1 by a small amount.

In an embodiment, the age adjuster 240B receives the accumulated age AGE1 and the age parameter PAR and determines the final age AGE2. The age parameter PAR is determined by the parameter determiner 220 in the sensing period. The age adjuster 240B converts the accumulated age AGE1 to the final age AGE2 using the age parameter PAR.

In an embodiment, the grayscale value compensator 250 compensates an input grayscale value GRAY1 of the input image data IMG to generate the compensated grayscale value GRAY2 based on the final age AGE2. The grayscale value compensator 250 outputs the compensated grayscale value GRAY2 to the age accumulator 230.

In an embodiment, the driving controller 200 generates the data signal DATA based on the compensation grayscale value GRAY2 and outputs the data signal DATA to the data driver 500.

According to a present embodiment, the sensed age SAGE is generated based on sensing data SEN that includes characteristics of the light emitting element EE of the display panel 100, and the sensing age SAGE is compared to the accumulated age AGE1 generated using the accumulated grayscale values to generate the age compensation values PAR and WT. The final age AGE2 is determined using the age compensation values PAR and WT so that the age of the light emitting element EE can be accurately predicted.

According to an embodiment, a driving controller 200 of a display apparatus includes an age determiner 210 that generates a sensed age SAGE based on sensing data SEN of a pixel, a compensation value determiner that determines an age compensation value using the sensed age SAGE and an accumulated age, an age accumulator that generates the accumulated age by accumulating compensated grayscale value GRAY2 of input image data, and a grayscale compensator that compensates an input grayscale value GRAY1 of the input image data and generates the compensated grayscale value GRAY2 based on a final age. The driving controller generates a data signal from the compensated grayscale value of the input image data, and a data driver 500 of the display apparatus converts the data signal to a data voltage and outputs the data voltage to the display panel.

In an embodiment, the compensation value determiner is a parameter determiner 220 that determines an age parameter PAR using the sensed age SAGE and the accumulated age AGE1, where the age parameter PAR is the age compensation value. The driving controller further comprises an age adjuster 240 that receives the accumulated age AGE1 and the age parameter PAR and determines the final age AGE2.

In an embodiment, the compensation value determiner is a weight determiner 225 that determines an age weight WT using the sensed age SAGE and the accumulated age AGE, where the age weight WT is the age compensation value, and the final age is the accumulated age AGE.

In an embodiment the compensation value determiner includes a parameter determiner 220 that determines an age parameter PAR using the sensed age SAGE and the accumulated age AGE1, and a weight determiner 225 that determines an age weight WT using the sensed age SAGE and the accumulated age AGE1, where the age compensation value includes the age parameter PAR and the age weight WT. The age accumulator 230B generates the accumulated age AGE1 by applying the age weight WT to the compensated grayscale value GRAY2 of the input image data. The driving controller further comprises an age adjuster 240B that receives the accumulated age AGE1 and the age parameter PAR and determines the final age AGE2.

In an embodiment, the sensed age SAGE is calculated in the sensing period and the accumulated age AGE1 is calculated in every frame. Even in the non-sensing period between the sensing periods, the age compensation values PAR and WT that represent the sensed age SAGE and the accumulated age AGE1 are continuously reflected in the final age AGE2 so that the prediction accuracy of the final age AGE2 is enhanced in the non-sensing period.

In an embodiment, the age of the light emitting element EE is accurately predicted and the image of the display panel 100 is compensated using the age so that the display quality of the display panel 100 can be enhanced. In addition, the sensing cycle is set relatively long, so that the number of sensing times can be reduced and the inconvenience of a user can be minimized.

According to a present embodiment, a display quality of a display panel can be enhanced.

The foregoing is illustrative of embodiments of the present inventive concept and is not to be construed as limiting thereof. Although a few embodiments of the present inventive concept have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of embodiments of the present inventive concept and is not to be construed as limited to the specific embodiments disclosed, and that modifications to the disclosed embodiments, as well as other embodiments, are intended to be included within the scope of the appended claims. Embodiments of the present inventive concept are defined by the following claims, with equivalents of the claims to be included therein.

What is claimed is:

1. A display apparatus, comprising:
a display panel that includes a pixel;
a driving controller that
generates an age compensation value using both of a sensed age generated based on sensing data received from a light emitting element of the pixel and an accumulated age generated based on compensated grayscale values of input image data,
generates a final age based on the age compensation value and the accumulated age, and
generates the compensated grayscale values of the input image data based on the final age and input grayscale values of the input image data, wherein a data signal is generated; and a data driver that converts the data signal to a data voltage and outputs the data voltage to the display panel, wherein a first cycle that generates the sensed age differs from a second cycle that generates the accumulated age.

2. The display apparatus of claim 1, wherein the driving controller comprises:

an age determiner that generates the sensed age based on the sensing data; and a parameter determiner that determines an age parameter using the sensed age and the accumulated age, wherein the age parameter is the age compensation value.

3. The display apparatus of claim 2, wherein the driving controller further comprises:

an age accumulator that generates the accumulated age by accumulating the compensated grayscale value of the input image data;

an age adjuster that receives the accumulated age and the age parameter and determines the final age; and a grayscale compensator that compensates the input grayscale value of the input image data and generates the compensated grayscale value based on the final age.

4. The display apparatus of claim 2, wherein the driving controller further comprises:

a first resolution converter that converts a resolution of the sensing data to a reference resolution and outputs the sensing data with the reference resolution to the age determiner; and a second resolution converter that converts a resolution of the accumulated age to the reference resolution and outputs the accumulated age with the reference resolution to the parameter determiner.

5. The display apparatus of claim 2, wherein the parameter determiner calculates first and second parameters a and b from a compensation function SAGE=a×AGE1+b, wherein SAGE denotes the sensed age, AGE1 denotes the accumulated age, a denotes a first parameter of the age parameter, and b denotes a second parameter of the age parameter.

6. The display apparatus of claim 1, wherein the driving controller comprises:

an age determiner that generates the sensed age based on the sensing data; and a weight determiner that determines an age weight using the sensed age and the accumulated age, wherein the age weight is the age compensation value.

7. The display apparatus of claim 6, wherein the driving controller further comprises:

an age accumulator that generates the accumulated age by applying the age weight to the compensated grayscale value of the input image data; and a grayscale compensator that compensates an input grayscale value of the input image data and generates the compensated grayscale value based on the accumulated age, wherein the final age is the accumulated age.

8. The display apparatus of claim 6, wherein the driving controller further comprises:

a first resolution converter that converts a resolution of the sensing data to a reference resolution and outputs the sensing data with the reference resolution to the age determiner; and a second resolution converter that converts a resolution of the accumulated age to the reference resolution and outputs the accumulated age with the reference resolution to the weight determiner.

9. The display apparatus of claim 6, wherein the weight determiner calculates the age weight WT from a compensation function SAGE=WT×AGE, wherein SAGE denotes the sensed age, AGE denotes the accumulated age, and WT denotes the age weight.

10. The display apparatus of claim 1, wherein the driving controller comprises:

an age determiner that generates the sensed age based on the sensing data;

a parameter determiner that determines an age parameter using the sensed age and the accumulated age; and a weight determiner that determine an age weight using the sensed age and the accumulated age wherein the age compensation value includes the age parameter and the age weight.

11. The display apparatus of claim 10, wherein the driving controller further comprises:

an age accumulator that generates the accumulated age by applying the age weight to the compensated grayscale value of the input image data;

an age adjuster that receives the accumulated age and the age parameter and determines the final age; and a grayscale compensator that compensates an input grayscale value of the input image data wherein the compensated grayscale value is generated based on the final age.

12. The display apparatus of claim 1, wherein the pixel comprises:

a first thin film transistor that applies a first power voltage to a second node in response to a signal of a first node;

a second thin film transistor that outputs the data voltage to the first node in response to a first signal;

a third thin film transistor that outputs a signal of the second node to a sensing node in response to a second signal;

a storage capacitor that includes a first end portion connected to the first node and a second end portion connected to the second node; and the light emitting element that includes a first electrode connected to the second node and a second electrode that receives a second power voltage.

13. A method of compensating an image of a display panel, the method comprising:

sensing a light emitting element of a pixel of the display panel and generating sensing data from the light emitting element of the pixel;

generating a sensed age based on the sensing data of the pixel;

generating an accumulated age based on compensated grayscale values of input image data;

generating an age compensation value using the both of sensed age and the accumulated age;

generating a final age based on the age compensation value and the accumulated age; and generating compensated grayscale values of the input image data based on the final age and input grayscale values of the input image data, wherein a first cycle that generates the sensed age differs from a second cycle that generates the accumulated age.

14. The method of claim 13, wherein a driving controller generates the sensed age based on the sensing data and determines an age parameter using the sensed age and the accumulated age in a sensing period when the pixel is sensed, wherein the age compensation value is the age parameter.

15. The method of claim 14, wherein the driving controller
- generates the accumulated age by accumulating the compensated grayscale value of the input image data,
- receives the accumulated age and the age parameter and determines the final age,
- compensates the input grayscale values of the input image data, and
- generates the compensated grayscale value based on the final age in a non-sensing period when the pixel is not sensed.

16. The method of claim 13, wherein a driving controller
- generates the sensed age based on the sensing data,
- determines an age parameter using the sensed age and the accumulated age, wherein the age compensation value is the age parameter,
- evaluates an afterimage using a test pattern to which the age parameter is applied in a test mode, and
- stores the age parameter when the afterimage satisfies an afterimage specification in a sensing period when the pixel is sensed.

17. The method of claim 13, wherein a driving controller
- generates the sensed age based on the sensing data and
- determines an age weight using the sensed age and the accumulated age in a sensing period when the pixel is sensed,
- wherein the age compensation value is the age weight.

18. The method of claim 17, wherein the driving controller
- generates the accumulated age by applying the age weight to the compensated grayscale value of the input image data,
- compensates an input grayscale value of the input image data, and
- generates the compensated grayscale value based on the accumulated age in a non-sensing period when the pixel is not sensed, and
- wherein the final age is the accumulated age.

19. The method of claim 13, wherein a driving controller
- generates the sensed age based on the sensing data,
- determine an age parameter using the sensed age and the accumulated age, and
- determines an age weight using the sensed age and the accumulated age in a sensing period when the pixel is sensed,
- wherein the age compensation value includes the age parameter and the age weight.

20. The method of claim 19, wherein the driving controller
- generates the accumulated age by applying the age weight to the compensated grayscale value of the input image data,
- receives the accumulated age and the age parameter, determines the final age, and
- compensates an input grayscale value of the input image data wherein the compensated grayscale value is generated based on the final age in a non-sensing period when the pixel is not sensed.

21. A display apparatus, comprising:
- a display panel that includes a pixel;
- a driving controller that includes
  - an age determiner that generates a sensed age based on sensing data received from a light emitting element of the pixel;
  - a compensation value determiner that determines an age compensation value using both of the sensed age and an accumulated age,
  - an age accumulator that generates the accumulated age by accumulating compensated grayscale values of input image data; and
  - a grayscale compensator that compensates an input grayscale value of the input image data and generates the compensated grayscale value based on the input grayscale value of the input image data and a final age generated from the sensed age and the accumulated age,
- wherein a first cycle that generates the sensed age differs from a second cycle that generates the accumulated age.

22. The display apparatus of claim 21,
- wherein the driving controller generates a data signal from the compensated grayscale value of the input image data; and
- wherein the display apparatus further comprises a data driver that converts the data signal to a data voltage and outputs the data voltage to the display panel.

23. The display apparatus of claim 21,
- wherein the compensation value determiner is a parameter determiner that determines an age parameter using the sensed age and the accumulated age, wherein the age parameter is the age compensation value, and
- wherein the driving controller further comprises an age adjuster that receives the accumulated age and the age parameter and determines the final age.

24. The display apparatus of claim 21, wherein
the compensation value determiner is a weight determiner that determines an age weight using the sensed age and the accumulated age, wherein the age weight is the age compensation value, and the final age is the accumulated age.

25. The display apparatus of claim 21, wherein
the compensation value determiner includes
- a parameter determiner that determines an age parameter using the sensed age and the accumulated age, and
- a weight determiner that determines an age weight using the sensed age and the accumulated age,
- wherein the age compensation value includes the age parameter and the age weight,
wherein the age accumulator generates the accumulated age by applying the age weight to the compensated grayscale value of the input image data,
and wherein the driving controller further comprises an age adjuster that receives the accumulated age and the age parameter and determines the final age.

* * * * *